(12) United States Patent
Stumbo

(10) Patent No.: US 6,455,821 B1
(45) Date of Patent: Sep. 24, 2002

(54) SYSTEM AND METHOD TO CONTROL TEMPERATURE OF AN ARTICLE

(75) Inventor: David P. Stumbo, Belmont, CA (US)

(73) Assignee: Nikon Corporation, Tokyo (JP)

( * ) Notice: Subject to any disclaimer, the term of this patent is extended or adjusted under 35 U.S.C. 154(b) by 7 days.

(21) Appl. No.: 09/639,951

(22) Filed: Aug. 17, 2000

(51) Int. Cl.$^7$ ................................................ H05B 1/02
(52) U.S. Cl. ...................... 219/497; 219/483; 219/486; 392/416
(58) Field of Search ................................ 392/413, 412, 392/411, 416; 219/483–486, 508, 502, 497, 494; 118/50.1, 724, 725

(56) References Cited

U.S. PATENT DOCUMENTS

| 3,790,412 | A | | 2/1974 | Moline | |
|---|---|---|---|---|---|
| 4,496,239 | A | | 1/1985 | Isohata et al. | |
| 4,668,077 | A | | 5/1987 | Tanaka | |
| 4,724,300 | A | | 2/1988 | Dearnaley | |
| 4,916,322 | A | | 4/1990 | Glavish et al. | |
| 4,944,645 | A | | 7/1990 | Suzuki | |
| 5,177,365 | A | | 1/1993 | Yamada | |
| 5,390,228 | A | | 2/1995 | Niibe et al. | |
| 5,428,203 | A | | 6/1995 | Kusunose | |
| 5,446,825 | A | * | 8/1995 | Moslehi et al. | 392/416 |
| 5,487,127 | A | * | 1/1996 | Gronet et al. | 392/416 |
| 5,551,985 | A | * | 9/1996 | Brors et al. | 118/725 |
| 5,742,065 | A | | 4/1998 | Gordon et al. | |
| 5,951,896 | A | * | 9/1999 | Mahawili | 219/411 |

OTHER PUBLICATIONS

K. Asch, et al., "Method of Keeping a Proximity Printing Mask at a Constant Temperature", IBM Technical Disclosure Bulletin, vol. 26, No. 7A, p. 3261 (Dec. 1983).

* cited by examiner

Primary Examiner—Mark Paschall
(74) Attorney, Agent, or Firm—Finnegan, Henderson, Farabow, Garrett & Dunner, L.L.P.

(57) ABSTRACT

The present invention comprises a system and method for the control of the temperature of an article, particularly in a vacuum. The system is applicable to control of reticle temperature in a electron beam or ion beam lithography system. The system includes non-contacting radiation heat sources to selectively apply localized radiant heat to achieve and maintain temperature uniformity across the reticle. The method generally includes applying initial heat once after the reticle is initially loaded into the lithography system from an external environment, applying exposure heat when other reticles are being exposed and applying heat during the wafer load cycle when a new wafer is loaded and the electron or ion beam is blanked. The operating temperature of the reticle is uniformly maintained at a temperature slightly above the ambient temperature. The temperature uniformly of the reticle is important for fabricating defect-free wafers, resulting in high yields.

23 Claims, 5 Drawing Sheets

SYSTEM AND METHOD TO CONTROL TEMPERATURE OF AN ARTICLE

FIELD OF THE INVENTION

The present invention relates generally to the control of temperature of an article. More particularly, the present invention relates to a system and method for the control of reticle temperature in lithography systems, especially in a vacuum environment.

BACKGROUND OF THE INVENTION

In an electron or ion beam lithography system or a semiconductor exposure apparatus, an electron beam or ion beam projector directs electron or ion beams to a resist layer on a wafer substrate through a reticle which is typically placed on a reticle support or stage. The electron or ion beams are directed toward particular areas of the reticle to expose patterns on the reticle onto the wafer substrate. Thus, because the electron or ion beams of radiation are of relatively high energy, the areas of the reticle being exposed absorb power from the incident electron or ion beams and is heated thereby. Heat strain on the reticle caused by temperature changes impairs accuracy and may cause distortions and errors.

For example, when a 100 kV, 100 μA electron beam is unblanked and directed at a reticle, a 2 μm silicon membrane or stripe of the reticle absorbs approximately 200 mW from the electron beam. Given a coefficient of thermal expansion of 2.6 ppm/K for silicon, a 1° K. rise over a 132 mm stripe length will cause approximately 343 nm of expansion. Such expansion may lead to error in the pattern exposed onto the wafer and reduce yield. To avoid such error and distortion, the temperature of the reticle is therefore preferably controlled to within a small fraction of a degree.

However, because the reticle is in a vacuum, controlling the temperature of the reticle silicon membrane presents a difficult challenge. In particular, heat transfer through convection is not available in a vacuum. Without convection, heat must be removed from the silicon by conduction and/or radiation.

In addition, removal of heat from the reticle by conduction is also difficult to achieve in a vacuum. In air, most of the heat transfer between, for example, two metal plates in contact with each other is actually transferred by convection across microscopic gaps between the metal plates with air serving as the fluid. The microscopic gaps generally result from surface roughness. Since the microscopic gaps are relatively small, the thermal conductivity is high and the overall thermal conductivity is usually determined by the material properties of the metal plates.

In a vacuum, heat transfer by conduction requires good thermal contact between two surfaces. To achieve good thermal contact between two surfaces, the clamping forces between the two surfaces must be very high. Alternatively, a compliant material or gasket may be utilized between the two surfaces. A third approach to overcome the contact thermal resistance problem in the case of the reticle heating in a vacuum is to provide a coolant in direct contact with the reticle.

These above-described approaches are undesirable for achieving reticle cooling particularly in view of the operating constraints of the lithography system. For example, reticles must be installed and removed quickly and repeatably on the reticle stage. Applying high clamping forces to the reticle would make the reticle installation and removal from the reticle stage time consuming, difficult and would likely not provide adequate repeatability. In addition, high clamping forces would likely create significant distortion. Installing gaskets would also not provide adequate repeatability and the gaskets are subject to wear and particulate generation. Attaching and disconnecting coolant sources and interconnections would also be very difficult and time consuming.

For the reasons set forth above, radiation has been explored as a method to cool the reticles or masks in a vacuum for both electron and ion lithography systems. For example, U.S. Pat. No. 4,916,322 entitled "Arrangement for Stabilizing an Irradiated Mask" to Glavish et al., the entirety of which is incorporated herein by reference, discloses providing one or more cooling surfaces disposed adjacent the mask and the mask stage. The cooling surface surrounds an optical path of the beam in the field of view of the mask in the mask exposure station between the mask and the radiation source and/or behind the mask. As energy from the energy beam is transferred to the mask, the cooling surfaces compensate for the thermal energy transfer by transferring thermal energy by thermal radiation from the mask to the cooling surface. Such thermal energy compensation by the cooling surfaces is said to maintain the mask at approximately the chamber temperature during an irradiation. The cooling surface may be provided by a metal cooling tube which has a diameter larger than the mask such that the cooling tube does not block the optical path of the radiation source.

However, the cooling surface or tube disclosed by Glavish et al. is centrally place over the entire reticle, despite that the ion or electron beam is only focused on specific lines or areas of the reticle and does not uniformly heat the entire reticle at one time. Glavish et al. merely attempt to control the temperature of the reticle as a whole by cooling. Glavish et al. do not attempt to compensate for localized temperatures changes which may cause reticle distortion. Thus, an undesirable temperature gradient may nonetheless result.

U.S. Pat. No. 5,390,228 entitled "Method of and Apparatus for Stabilizing Shapes of Objects, Such as Optical Elements, as well as Exposure Apparatus Using Same and Method of Manufacturing Semiconductor Devices" to Niibe et al., the entirety of which is incorporated herein by reference, discloses determining a temperature distribution of a mask in a thermally stable state and controlling the temperature distribution of the mask being irradiated with radiation energy to be the same as the temperature distribution in the thermally stable state. The temperature distribution is controlled by providing a holder which holds as well as cools the mask and a heating means having resistance wires on a surface of the mask facing the direction of the incident beams to heat the surface of the mask.

The temperature control disclosed by Niibe et al. is of the entire reticle and because Niibe et al. utilize a reflective mask, Niibe et al. are not concerned with the localized heating of the reticle in an ion or electron beam system which can cause physical distortion of the reticle. Thus, Niibe et al. merely attempt to control the temperature of the reticle as a whole by cooling and heating.

It would thus be desirable to provide a method for reticle temperature control to reliably maintain the temperature of the reticle within a small fraction of a degree. It would also be desirable to improve temperature uniformity over the surface of the reticle. It would further be desirable to provide a method for reticle temperature control which is not time consuming, is simple to implement and provides good repeatability characteristics.

SUMMARY OF THE INVENTION

The present invention comprises a method for the control of the temperature of an article, particularly an article placed in a vacuum chamber and where the article is subjected to localized energy inputs. The method of the present invention comprises selectively applying irradiation to regions of the article to achieve and maintain temperature uniformity across the article. Since the application of radiation heat with radiation heat sources is non-contacting and obviates the need for physical contact or wires leading to the article, the temperature control apparatus can be relatively simple.

The system and method of the present invention may be utilized to control the temperature of a reticle in both electron and ion lithography systems or other systems. Radiant heat cycles are applied to control the temperature of the reticle geographically, depending upon the areas heated by the beams as a function of time and upon cycles such as wafer load cycle during which the reticle may experience a temperature decrease.

The method generally comprises applying initial heat after the reticle is initially loaded into the lithography system from an external environment, applying exposure heat when other reticles are being exposed and applying heat during the wafer load cycle when a new wafer is loaded and the electron or ion beam is blanked. The initial heat is only applied once when the reticle is initially loaded into the lithography system from the external environment The present invention uniformly maintains the operating temperature of the reticle at a temperature slightly above the ambient temperature. When an incident electron or ion beam is directed at a region of the reticle, the localized temperature of that region will increase due to the energy of the beam. To equalize the localized temperature increase, radiant heating is applied selectively to certain other regions of the reticle in order to achieve and maintain temperature uniformity across the reticle. Achieving and maintaining temperature uniformity of the reticle is important for fabricating defect-free wafers, resulting in high yields.

The higher operating temperature of the reticle can be easily accounted for and compensated during design to ensure accuracy and result in a high yield. For example, the higher operating temperature of the reticle can be compensated by slightly lowering the ambient temperature, adjusting the design of the reticle and/or adjusting the application of the electron or ion beams in the lithography system.

These and other objects, features, and advantages of the invention will become readily apparent to those skilled in the art in view of the drawings and the description of the invention below.

DESCRIPTION OF THE INVENTION

Figure 1:
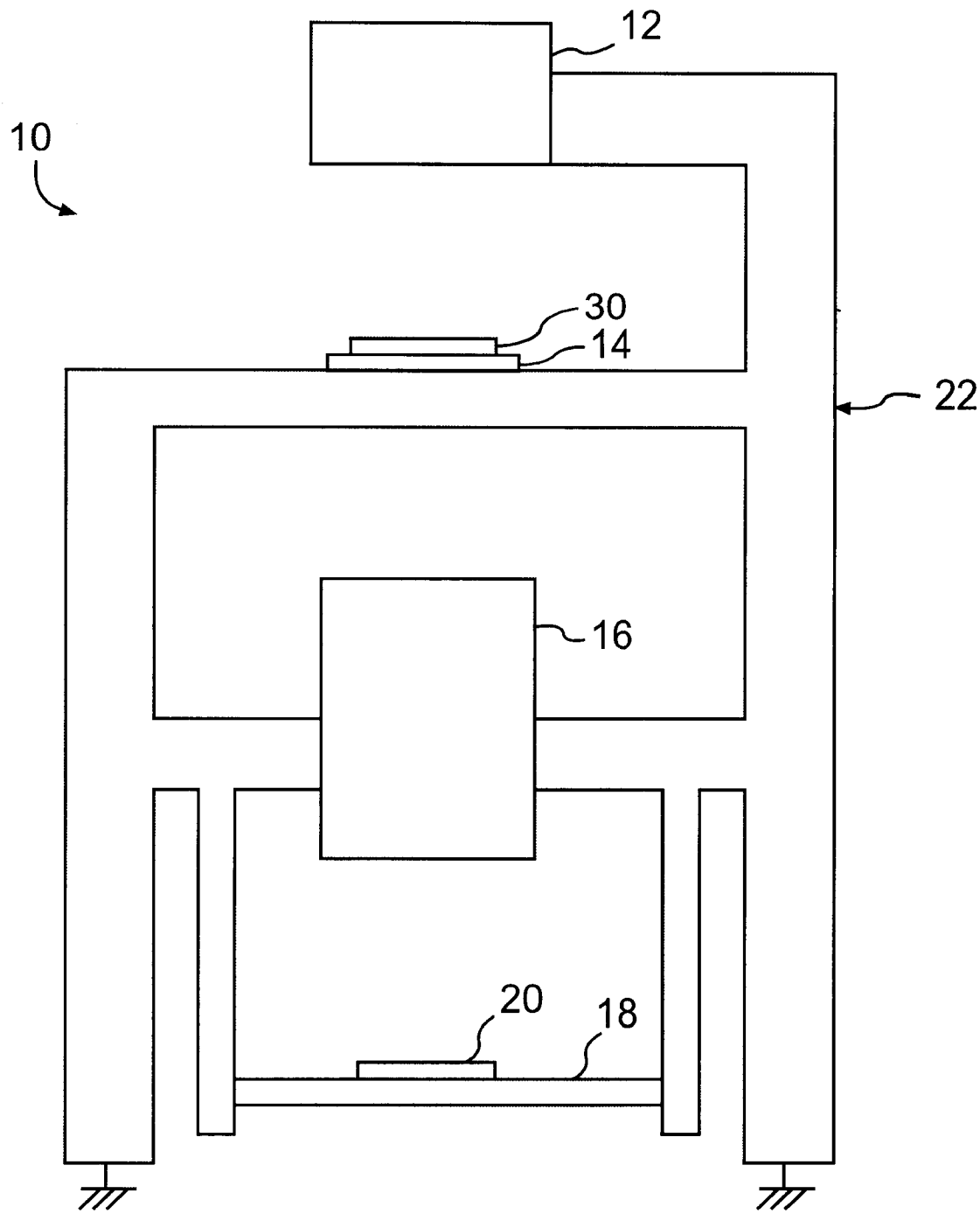
FIG. 1 is a simplified partial side view of an example of a lithography system in which the system and method of the present invention for controlling reticle temperature with radiant heating may be implemented.

FIG. 1 is a simplified partial side view of an example of a lithography system 10 in which the system and method of the present invention for controlling reticle temperature with radiant heating may be implemented. The lithographic system 10 generally comprises an illumination system or radiation source 12 such as an electron beam (e-beam) or an ion beam generator, a reticle stage 14 for supporting a reticle 30 in a vacuum, a lens system 16, and a wafer handling system 18 for supporting and positioning a resist or photoresist covered wafer 20. The reticle 30, the lens system 16 and the wafer 20 are all positioned in the optical path of the radiation source 12 such that the electron or ion beam projected through the lens system 16 exposes the pattern of the reticle 30 (e.g., a circuit pattern for a semiconductor device) onto the wafer 20. The lithographic system 10 further comprises a frame 22 which supports the radiation source 12, the reticle stage 14, the lens system 16 and the wafer handling system 18. It should be understood that the lithography system illustrated in FIG. 1 is merely illustrative and variations of the lithography system would not affect the applicability of the inventive system or method for controlling reticle temperature.

Figure 2:
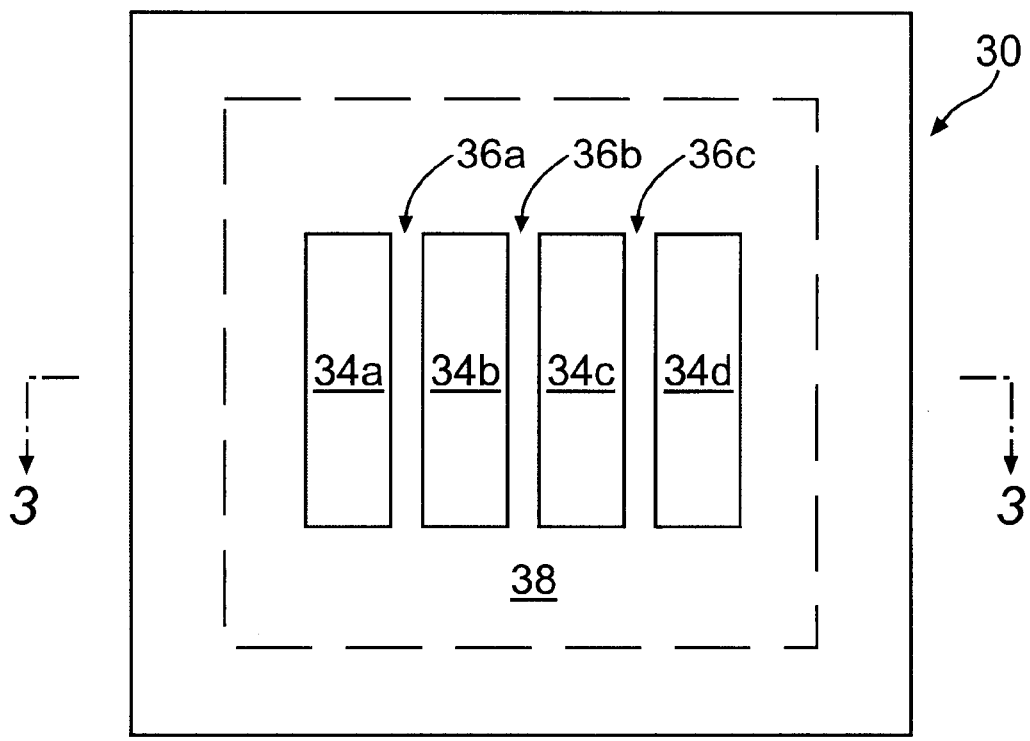
FIG. 2 is a schematic of an example of a reticle for use with the system and method of the present invention.
Figure 3:
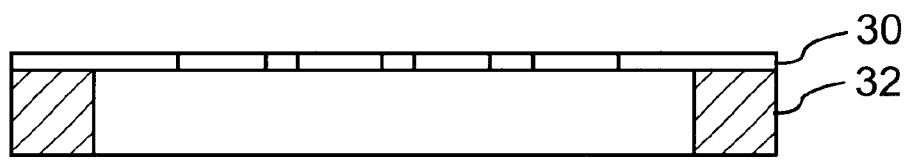
FIG. 3 is a side view of the reticle of FIG. 2.

FIG. 2 is a schematic of an example of a reticle 30 and FIG. 3 is a cross-sectional view along line 3—3 of the reticle 30 of FIG. 2. A perimeter of the reticle 30 is mounted on a mounting ring 32, as shown in phantom in FIG. 2 and in the cross-sectional view of FIG. 3. The reticle 30 includes four thin membranes or stripes 34a, 34b, 34c, 34d each of which carries the patterns (not shown) to be exposed onto the wafer. Three struts 36a, 36b, 36c are disposed between the four membranes 34a–d. In addition, unpatterned and generally relatively thick silicon support 38 surrounds the four stripes 34a–d and three struts 36a–c.

When an incident electron or ion beam is directed at one of the four membranes 34a–d, the temperature of the membrane will increase due to the high energy of the beam. To equalize the localized temperature increase, radiant heating is applied selectively to certain regions of the reticle 30 in order to achieve and maintain temperature uniformity across the reticle, or at least portions of the reticle near the membranes. Achieving and maintaining temperature uniformity of the reticle is important for fabricating defect-free wafers, resulting in high yields.

The method of radiant heating of the present invention generally comprises applying radiant heat selectively to certain regions of the reticle 30 to achieve temperature uniformity. For a given reticle, the method comprises applying initial heat when the reticle is initially loaded, applying exposure heat when other reticles are being exposed and applying heat during the wafer load cycle when a new wafer is loaded. Each of these applications of heat is achieved by the application of radiant heat by radiant heat sources. In the system and method of the present invention, the use of irradiation heat sources obviates the need for physical contact or wires leading to the reticle.

The initial heat is applied to the regions along the perimeter of the reticle 30 over the mounting ring 32. This initial heating is only performed once after the reticle 30 is initially brought into the vacuum chamber of the lithography system.

The initial heating of the reticle 30 after the initial reticle loading is preferably performed in the reticle load lock rather than under the column in the field of view of the optics. The initial heating may be achieved by directing radiant heat from fourteen (14) heat sources at regions along the perimeter of the reticle 30. However, as is evident, any suitable number of heat sources may be utilized.

The initial heating requires a higher output level from the heat source than does subsequent selective radiant heating because the initial heating must bring the reticle and the mounting ring up to the operating temperature. The operating temperature is preferably approximately 0.5 to to 100° K. above the ambient temperature and more preferably approximately 2 to 10° K. above the ambient temperature. For example, the ambient temperature may be at 25° C. (298° K.) and the operating temperature may be at 27° C. (300° K.). Because of the required higher output, quartz-halogen lamps may be utilized for this initial heat step.

During the exposure cycles, an exposure heat is applied to the reticle when the other reticles are being exposed. Typically, more than one reticle is utilized to expose the desired pattern onto the wafer. For example, there may be four reticles such that for a given reticle, the reticle. is only being exposed one-fourth of the time and the other three reticles are being exposed three-fourths of the time. Thus, the reticle may experience some cooling when it is not being exposed.

When a reticle is not exposed by electron or ion beams, the reticle is preferably maintained at the operating temperature such that no significant heating is required prior to the reticle being exposed by electron or ion beams. Preferably, two heat sources apply the heat (the "exposure heat") to the reticle during the exposure of the other reticles to the two outside struts 36a, 36c. Because the temperature of the central portion of the reticle 30 maintains a more constant temperature than the perimeter, due to radial heat flow and because the perimeter of the reticle 30 will cool at a faster rate, only the outside struts 36a, 36c typically need to be radiated. However, heating of alternative combinations of components in this and other heating cycles may be implemented to achieve the same or similar resuilt.

After the exposure cycles are complete, a new wafer to be exposed is loaded. A wafer load heat is applied to the reticle during this wafer load cycle to maintain the elevated operating temperature of the reticle. The radiant heat is preferably supplied by four heat sources to the four stripes 34a–d. This wafer load heat thus maintains the elevated temperature of the reticle relative to the ambient temperature while the electron or ion beam is blanked.

Heating an article in a vacuum is typically achieved through infrared radiant heating. For the relatively low heat requirements of the present invention, light emitting diodes (LEDs), laser diodes, semiconductor lasers as well as quartz-halogen lamps may be utilized. Narrow-band radiation can also be efficiently delivered via optical fibers and/or through vacuum windows. The use of optical fibers and/or vacuum windows allows the placement of the heat sources away from sensitive areas near the column or field of view of the optics. The specific configuration of the lithography system utilizing the reticle temperature control method and system of the present invention is flexible and can be varied depending upon system constraints.

A model, analysis and simulation are presented below to better illustrate the system and method of the present invention as well as its function and effect.

Figure 4:
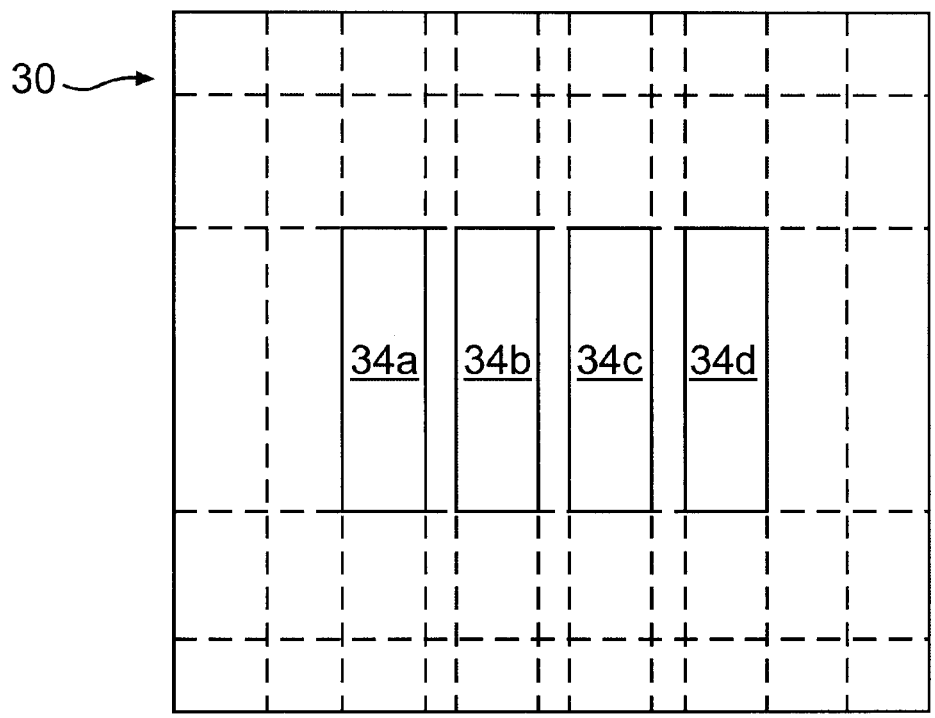
FIG. 4 is a schematic of an example of a reticle divided into multiple elements for use in modeling the temperature of the reticle.

As shown in phantom in the plane view of FIG. 4, the reticle 30 is modeled by dividing the reticle into fifty-five (55) elements arranged in five (5) rows and eleven (11) columns. The model of the reticle 30 comprises twenty-eight (28) elements along the periphery over the 10 mm by 10 mm mounting ring 32; four (4) 25.7 mm wide by 132.3 mm tall elements defining the stripes 34a–d; three (3) 5 mm wide elements defining struts between the four (4) stripes; and twenty (20) remaining elements around the stripes and the struts defining the unpatterned silicon support.

A stripe or membrane thickness of 2 $\mu$m is assumed for the modeling and analysis. However, the stripes 34a–d are modeled as 0.2 mm thick silicon to account for the proportion of the area covered by grillage. Other membrane thickness may also be utilized. Membrane thickness substantially less than 0.5 $\mu$m may be sufficiently thick to provide the required scattering and may still be adequately robust. For example, a 1 mm by 1 mm membrane having a thickness of 0.5 $\mu$m may be utilized. Since power dissipated by the membrane varies linearly with thickness, the required power can be easily modified. For example, the required power may be reduced in half by utilizing a membrane thickness of 1 $\mu$m rather than 2 $\mu$m.

The model utilizes a linear thermal modeling of the reticle. For small temperature changes $\Delta T$ ($\Delta T = T_2 - T_1$, where $T_1$ is the ambient temperature and $T_2$ is the localized temperature of the reticle) in the linear thermal modeling of the reticle, the flow of heat and heat loss by radiation of less than 1–2% (3–5° K.) are modeled as linear and the material properties are assumed to be constant.

Heat transfer (q) by radiation, defined as the heat transfer by radiation between two bodies with thermal emissivity $\epsilon_1$ and $\epsilon_2$, is linearized and simplified by assuming:

$$\epsilon_1 = \epsilon_2 = 0.7$$

such that:

$$q = 3.29 \text{ W}/(\text{m}^{2\circ}\text{ K.}) \text{ where } T_1 = 300° \text{ K.}$$

By linearizing heat transfer (q) by radiation, circuit analysis tools may be utilized to model the thermal behavior of the reticle, as is known in the art.

Figure 5:
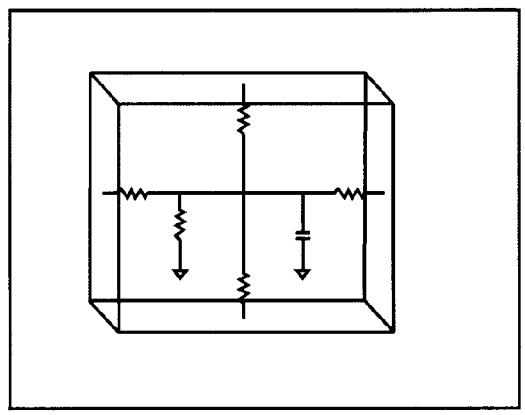
FIG. 5 is a circuit model of one element of the reticle of FIG. 4.

In the circuit model, thermal conductivity of a material is modeled as a resistor, heat flux as current, and temperature as voltage. For non-steady state, the heat capacity of a material is modeled as a capacitor to ground and the heat loss by radiation is also modeled as a resistor. A rectangular element of the material can be modeled as a capacitor and five resistors: a capacitor to ground (heat capacitance), a resistor to ground (heat loss by radiation), and four resistors connecting a center node to each of the four edges (thermal conductivity). FIG. 5 shows a circuit model of such an element. A reticle can thus be modeled as a combination of such elements.

For each element, the values for the resistors and capacitors are determined by the geometry and the material (silicon) as follows:

$$R_{center\ to\ edge} = 6.41 \times 10^{-3} \times \text{width}/2 \times \text{height} \times \text{thickness}$$

$$R_{center\ to\ top/bottom} = 6.41 \times 10_{-3} \times \text{height}/2 \times \text{width} \times \text{thickness}$$

$$R_{radiation} = (2 \times \text{height} \times \text{width} \times 0.329)^{-1}$$

$$C = \text{height} \times \text{width} \times \text{thickness} \times 1.65 \times 10^6$$

In addition, heat loss by radiation from the inside and outside of the mounting ring 32 is provided by adding appropriate resistors from the outside edge of the mounting ring elements. Further, time-varying current sources are added to the model to represent electron beam heating and additional heat sources utilized to control the reticle temperature as provided by the system and method of the present invention.

TABLE 1 lists the parameters and the corresponding values utilized in the linear model.

TABLE 1

| Parameter | Value |
| --- | --- |
| Power Absorbed from Electron Beam | 200 mW |
| Resist Sensitivity | 5 $\mu C\ cm^{-2}$ |
| Blanking Time | 25 $\mu sec$ |
| Number of Reticles | 4 |
| Number of Stripes Per Reticle | 4 |
| Cycle Time | 4.576 seconds |
| Load Time | 18 seconds |

TABLE 2 lists examples of the amplitude, duration and quantity of heat sources for the model, analysis and simulation described herein. The values in TABLE 2 are utilized for both the conductive cooling case and the geographically controlled radiation heating case. For the conductive cooling case, only the heat as a result of the electron beam exposure is modeled.

For the geographically controlled radiation heating case, in addition to modeling the heat transfer from the electron beam exposure, each of the heating steps of the present invention to control heating of the reticle and to ensure temperature uniformity of the reticle are modeled. As described above, the method of radiant heating of the present invention generally comprises selectively applying radiant heat to certain geographic regions of the reticle to achieve thermal uniformity. For a given reticle, the method comprises applying initial heat once after the reticle is initially loaded, applying exposure heat after the exposure cycles have commenced and while exposing other reticles, and applying heat during the wafer load cycle after the exposure cycles have completed for the wafer and a new wafer is loaded.

The values listed in TABLE 2 for the initial heat, exposure heat and wafer load heat of the geographically controlled radiation heating case also constitute the parameters for the amplitude, duration, location and quantity of the heaters in one embodiment of the present invention.

TABLE 2

| Step | Amplitude | Duration | Number of Heat Sources | Locations |
| --- | --- | --- | --- | --- |
| Initial Heat | 2.2 W | 3.25 seconds | 8 | Ring top and bottom |
| | 10.5 W | 3.25 seconds | 2 | Ring left and right |
| | 497 mW | 3.25 seconds | 2 | Inner Stripes |
| | 520 mW | 3.23 seconds | 2 | Outer Stripes |
| Exposure Heat | 1.73 mW | 3.97 seconds | 1 | Left outer strut |
| | 1.73 mW | 3.97 seconds | 1 | Right outer strut |
| Wafer Load | 5.15 mW | 18.3 seconds | 4 | All stripes |
| Electron Beam Exposure | 200 mW | 0.132 seconds | 1 | Outer left stripe |
| | 200 mW | 0.132 seconds | 1 | Inner left stripe |
| | 200 mW | 0.132 seconds | 1 | Inner right stripe |
| | 200 mW | 0.132 seconds | 1 | Outer right stripe |

The first step of the inventive method is the initial heat step. When the reticle is placed in the vacuum environment of the lithography system from an external environment, the initial heating step is performed. The initial heating of the reticle raises the temperature of the reticle to the operating temperature and is only performed when the reticle is first brought into the vacuum environment. The operating temperature of the reticle is preferably approximately 0.5 to to 10° K. above the ambient temperature and more preferably approximately 2 to 10° K. above the ambient temperature. For example, where the ambient temperature is at approximately 25° C. (298° K.), the operating temperature is preferably at approximately 27° C. (300° K.).

The desired elevated uniform operating temperature of the reticle may be determined by the particular application, the ambient temperature and the energy applied by the incident beams such as electron or ion beams. The elevated uniform operating temperature of the reticle is preferably sufficiently high such that the maximum radiant heat output of the reticle is greater than that of the electron or ion beam input. The amount of the electron or ion beam input is generally affected by the beam current, beam voltage, beam duty cycle, reticle area, membrane area, membrane thickness, reticle emissivity, and any heat flow into the reticle heater. In addition, additional heat at points of contact may be provided.

The initial heat step utilizes fourteen (14) heat sources to simulate the initial heating step. These heat sources are significantly more powerful than those used for the other heating steps. In particular, the initial heat step heat sources total 40.6 W for 3.25 seconds. In an actual lithography system, more than 3.25 seconds are available for the initial heating of the reticle and thus less power and a longer duration may be required and/or used.

During the exposure cycles for both the conductive cooling case and the radiation cooling and geographically controlled heating case, the heating by the electron or ion beam is modeled as four current sources connected to the four stripe elements. The heat applied to the stripes is turned on and off similar to the actual operation of the lithography system. Thus, the temperatures of the four stripes are slightly out of phase and there is a temperature decrease when the other (not modeled) stripes are being exposed.

The heat sources apply heat during the exposure heat cycle when the other reticles are being exposed. Four very small point heat sources each at 1.73 mW are provided to heat the outer stripes and the adjacent silicon area by directing the heat toward the outside struts. This heating maintains the reticle uniformly at the elevated operating temperature such that no significant heating is required prior to the reticle being exposed by electron or ion beams.

After the exposure cycles are complete, a wafer load heat is applied during the wafer load cycle when a new wafer to be exposed is loaded. The wafer load heat is provided by four small point heat sources each at 5.15 mW. The wafer load heat smoothes out temperature fluctuations of the reticle during wafer loading. These small heat sources direct heat to all four stripes 34a–d and merely make up for the average effect of the blanked beam during wafer loading. These heat sources are applied continuously during the wafer load cycle.

Figure 6:
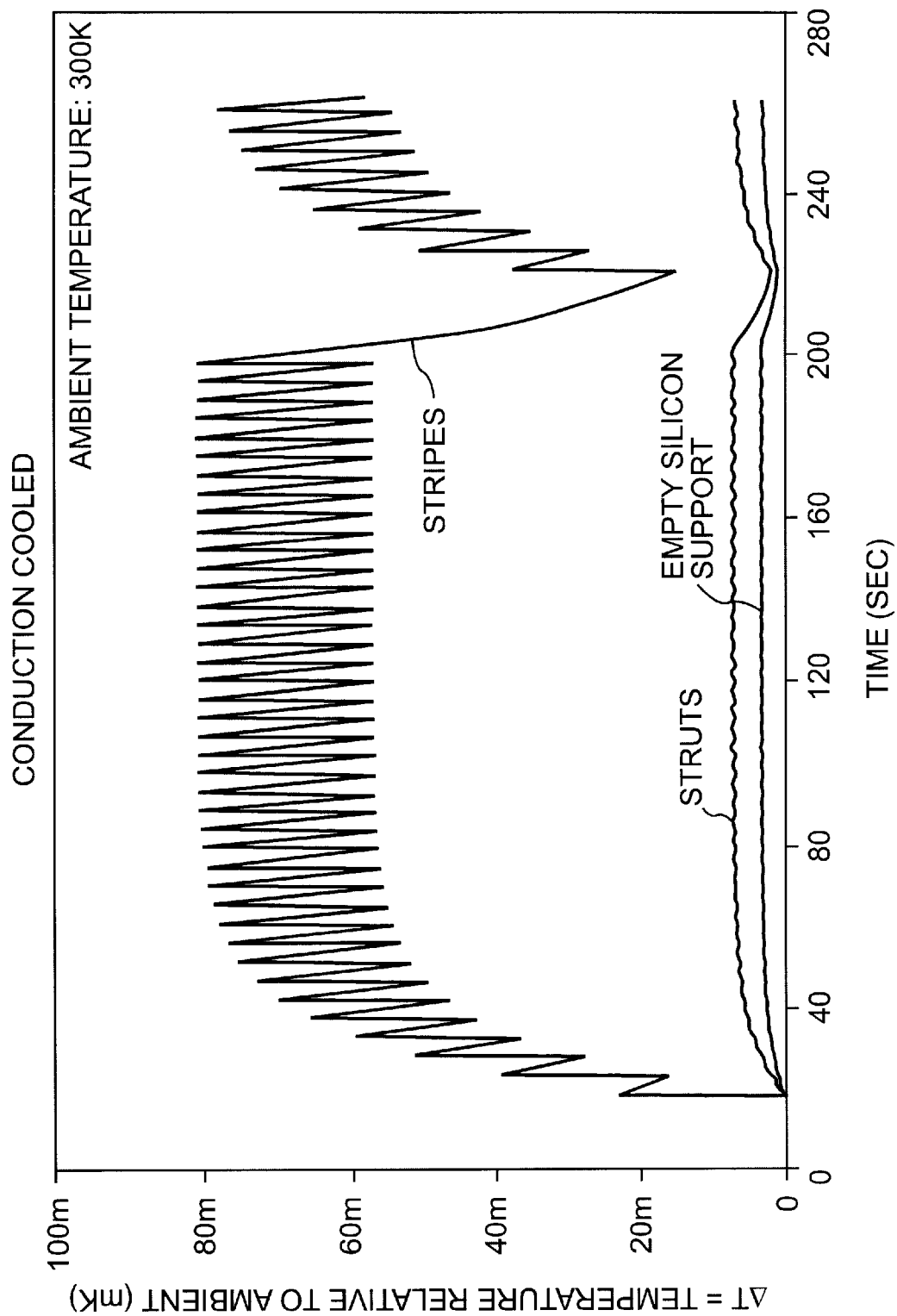
FIG. 6 is a graphic representation of the modeled temperature of the reticle subjected to electron beam exposures and wafer load cycles in the conduction cooled case.
Figure 7:
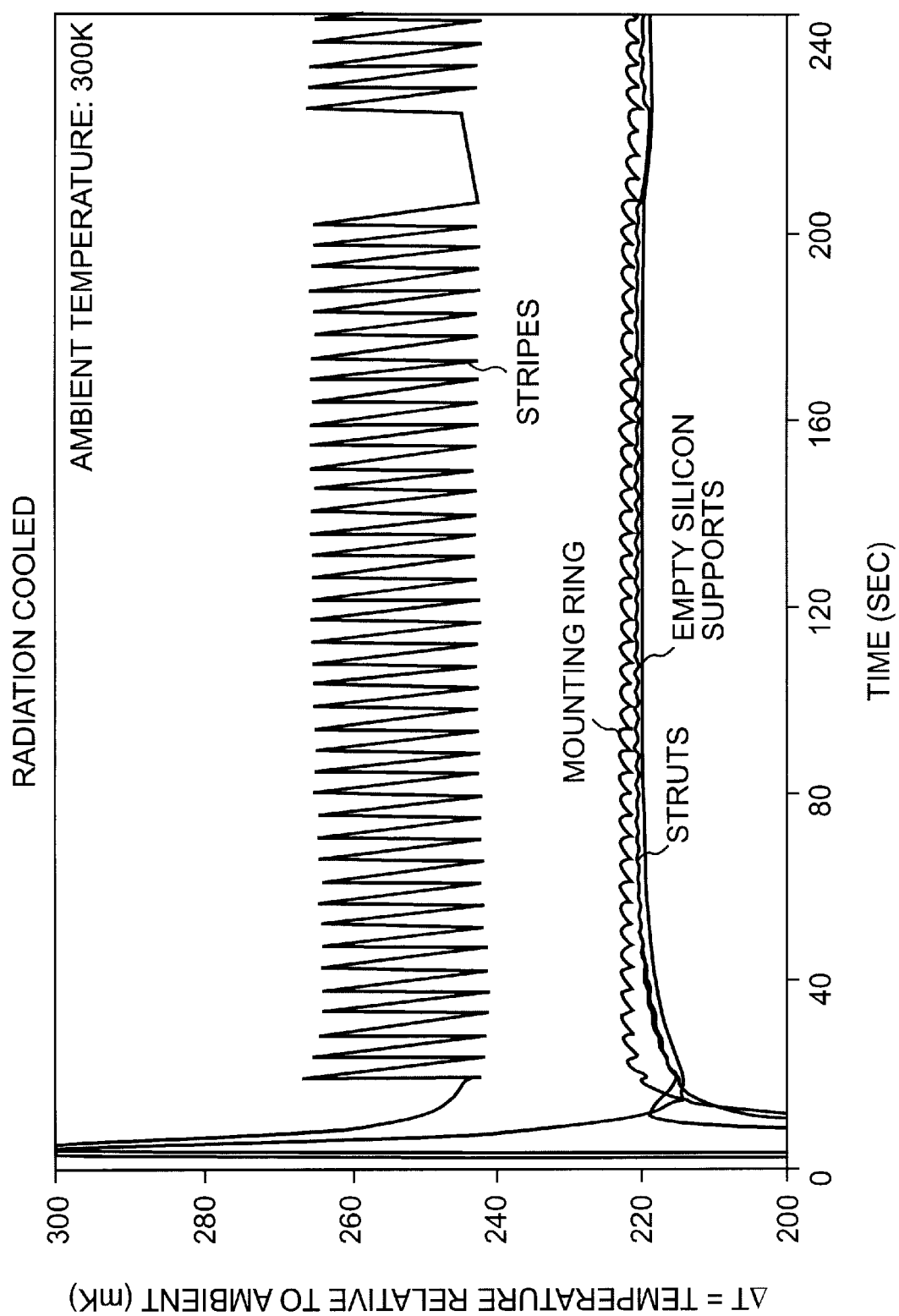
FIG. 7 is a graphic representation of the modeled temperature of the reticle subjected to electron beam exposures, wafer load cycles and applied radiant heat cycles for geographically controlled radiation heating of the reticle according to a preferred embodiment of the present invention.

FIGS. 6 and 7 show the results of simulations using the linear model described above. For both graphs of FIGS. 6 and 7, the X-axis represents time in seconds and the Y-axis represents ΔT in degrees Kelvin (° K.) where the ambient temperature is 27° C. or 300° K. The graphs are linearized at 300° K. The graph of FIG. 6 illustrates the temperature versus time at various points on the reticle when the reticle is heated by electron beams and cooled by conduction at the mounting ring, where the mounting ring is modeled as connected to thermal ground (ambient temperature). The graph of FIG. 7 illustrates the temperature versus time at various points on the reticle when the reticle is heated by electron beams and selectively geographically heated by radiant heat at various regions of the reticle.

In both simulations, the following operations were simulated sequentially:
(1) Initial heating of a reticle occurs from 0 to 20 seconds after the reticle is brought into the vacuum chamber from an external environment.
(2) A first wafer is subjected to 40 exposure cycles.
(3) A wafer load cycle during which the first wafer is removed and a second wafer is loaded.

The 40 exposure cycles are evident in both graphs of FIGS. 6 and 7. The reticle is assumed to be one of a group of four reticles whose patterns are exposed onto the first resist covered wafer such that the reticle being modeled is exposed by electron beam for approximately one-fourth of each exposure cycle during each exposure cycle. During the other three-fourths of each exposure cycle, the other three reticles of the group of four reticles are exposed and thus the reticle being modeled experiences a cool down period. Further, the approximately 20-second intervals starting at time=0 second and time=200 seconds are wafer load times during which the electron beam is blanked.

In each of the graphs of FIGS. 6 and 7, the uppermost curve is plots the temperature of the four stripes, the lowest curve is plots the temperature of the unpatterned silicon support 38 and the second lowest curve plots the temperature of the struts. In the graph of FIG. 7, the third lowest curve for the geographically controlled radiation heating case is the temperature of the mounting ring.

Several observations and comparisons can be made about the simulation results of the temperatures of the reticle utilizing conduction cooling and the temperatures of the reticle utilizing geographically controlled radiation heating and geographically controlled heating to control the reticle temperature.

First, the initial heating of a reticle brought into the vacuum chamber prior to initiation of the exposure cycles occurs from 0 to 20 seconds. Generally, there are two different time constants in operation. The first time constant is associated with the heat transfer or temperature equalization between the reticle and the environment and is on the order of hours. The second time constant is associated with the heat transfer or temperature equalization between the center of the reticle and the mounting ring. The second time constant determines the amount of time required for the reticle temperature to become uniform or equalize when only certain areas are heated.

In the case of conduction cooling, the initial transients do not disappear until approximately 60 seconds later after the reticle is loaded. In contrast, in the case of radiation cooling and geographically controlled heating, the initial transients disappear in less than 20 seconds. Further, the second, shorter time constant, i.e. the time required for the reticle temperature to become uniform when certain areas are heated is about 20 seconds for the conduction cooling case and only about 8 seconds for the geographically controlled radiation heating case.

A second time constant of 8 seconds is therefore a more desirable and highly advantageous characteristic of using geographically controlled radiation heating for reticle temperature control, particularly when compared with the second time constant of 20 seconds when using conduction cooling. The short time constant of 8 seconds indicates that the location and uniformity of the heat sources are not particularly important because the temperature of the reticle equalizes quickly. In the radiation case, after the initial heating phase, the reticle is placed in a storage area, which is maintained at the normal operating temperature of the reticle, slightly elevated relative to the ambient temperature.

Next, the 40 exposure cycles of the electron beams are conducted from 18 to 200 seconds. In the conduction cooling case, the total temperature variation of the stripes during the exposure cycles is approximately 80 mK. In contrast, the total temperature variation of the stripes during the exposure cycles for the radiation cooled case is approximately 25 mK, is less than one-third the total temperature variation of the conduction cooled case. In addition, the temperature difference between the struts and the stripes is approximately 30 mK for the geographically controlled radiation heating case, compared to 60 mK for the conduction cooled case. Similarly, the temperature difference between the mounting ring and the stripes is approximately 30 mK for the geographically controlled radiation heating case, compared to 60 mK for the conduction cooled case.

Lastly, when the exposure of the first wafer is complete, the next wafer to be exposed is loaded during the wafer load cycle from 200 to 220 seconds. During the wafer load cycle, the temperature of the reticle is cooled 40 mK in the conduction cooled case whereas the temperature of the reticle remains approximately constant in the geographically controlled radiation heating case. As discussed above, in the geographically controlled radiation heating case, the reticle is heated during the wafer load cycle when the electron beams are blanked in order for the reticle to maintain a relatively constant and even temperature. Thus, by maintaining the temperature of the reticle with radiant heating, the startup temperature transient which occurs in the conduction case is eliminated.

The above-described observations are summarized in Table 3.

TABLE 3

| Parameter | Conduction Cooling | Geographically Controlled Radiation Heating |
|---|---|---|
| Stripes ΔT during electron beam exposure | 80 mK | 25 mK |
| Stripe to Stripe ΔT | 1 mK | 1 mK |
| Stripe to strut ΔT | 60 mK | 30 mK |
| Stripe to mounting ring ΔT | 80 mK | 35 mK |
| Time constant, over reticle | ~20 seconds | ~8 seconds |

As is evident, the geographically controlled radiation heated reticle generally has a more uniform temperature distribution. The differences in the time constants and the temperature differences between the stripes, the stripes and the strut, as well as stripe and the mounting ring are due at least in part to the differences in the direction of the heat flow between the conduction cooled case and the geographically controlled radiation heated case. In particular, in the conduction cooled case, the heat flow is generally in a radial direction toward the mounting ring and the radial heat flow thus creates a radial temperature gradient. In contrast, most of the heat flow is through the planar surfaces of the reticle near the region subjected to the heating, i.e. in a direction generally perpendicular to the plane of the reticle. Thus, adding small radiant heat sources in the geographically controlled radiation heating case facilitates temperature equalization of the reticle.

The modeling technique discussed above may be utilized to determine and optimize the application-specific location, amplitude, duration, and/or quantity of the radiant heat sources. Alternatively, tests may be conducted to obtain empirical data. For example, localized temperatures of the article at specific locations or regions may be determined with an infrared device. Resistance temperature detectors (RTDs), thermistors, or diodes may be placed on a test reticle for tuning or calibration.

The higher operating temperature can be easily compensated to ensure accuracy and result in a high yield. For example, the higher operating temperature can be compensated by slightly lowering the ambient temperature, adjusting the design of the reticle and/or adjusting the application of the electron or ion beams in the lithography system.

Although not shown, the system of the present invention also includes a controller for controlling the radiant heat sources. The controller controls the activation or turning on and off of the radiant heat sources, including the timing, duration and/or amplitude of the heating.

It is to be understood that the lithography system may be different than the one shown herein without departing from the scope of the invention. It is also to be understood that the system and method of controlling the temperature of an article of the present invention disclosed herein is not to be limited to wafer processing systems. Further, the temperature control of the present invention may be utilized for other components of the lithography system such as the optical components and/or the wafer.

Although the present invention has been described in the context of uniform radiant heating of a reticle in a lithography system, the present invention can be readily applied to an article in any other application, particularly to an article in a vacuum.

Although only a few exemplary embodiments of this invention have been described in detail above, those skilled in the art will readily appreciate that many modifications are possible in the exemplary embodiments without materially departing from the novel teachings and advantages of this invention. Thus, all matter contained in the above description and shown in the accompanying drawings shall be interpreted as illustrative and not limiting.

What is claimed is:

1. A temperature control system for an apparatus having an article and an energy source for applying cycles of localized energy to a subject region of the article, comprising:
   at least one first radiant heat source configured to apply localized radiant energy to at least a first portion of the article prior to the application of the cycles of localized energy to the article; and
   at least one second radiant heat source configured to apply localized radiant energy to at least a second portion of the article within a border of the first portion during at least a portion of the application of the cycles of localized energy to the article.

2. The temperature control system of claim 1, further comprising at least one third radiant heat source configured to apply localized radiant energy to at least a third portion of the article upon completion of the cycles of localized energy.

3. The temperature control system of claim 2, wherein at least one of said first and third portions of the article includes the subject region of the article.

4. The temperature control system of claim 1, wherein said second portion of the article is generally non-overlapping with the subject region of the article.

5. The temperature control system of claim 1, wherein said first radiant heat source has greater output than said second radiant heat source.

6. The temperature control system of claim 1, further comprising a controller to selectively activate said first and second radiant heat sources.

7. A lithography system, comprising:
   a radiation source arranged to expose a reticle to a beam of radiation, the reticle having an interior patterned region, a border region and an interior non-patterned region, the patterned region being exposed to the radiation source;
   at least one first radiant heat source adapted to apply localized radiant energy to at least the border region of the reticle prior to the radiation source exposing the reticle; and
   at least one second radiant heat source adapted to apply localized radiant energy to at least one of said interior regions of the reticle after exposure of the reticle to the radiation source.

8. The lithography system of claim 7, further comprising at least one third radiant heat source adapted to apply localized radiant energy to at least the interior non-patterned region of the reticle.

9. The lithography system of claim 8, wherein said third radiant heat source is adapted to apply localized energy only to the interior non-patterned region.

10. The lithography system of claim 7, wherein said second radiant heat source is adapted to apply localized energy to the patterned region of the reticle.

11. The lithography system of claim 7, wherein said first radiant heat source is further adapted to apply localized energy to the patterned region of the reticle.

12. The lithography system of claim 7, wherein said first radiant heat source has greater output than said second radiant heat source.

13. A method to control the temperature of an article subjected to cycles of localized irradiation, comprising:
   irradiating at least a portion of the article to generally uniformly change the temperature of the article relative to an ambient temperature prior to the article being subjected to cycles of localized irradiation; and
   irradiating localized portions of the article when the article is not subjected to the cycles of localized irradiation and after the irradiation cycles commenced to generally maintain the article at the changed temperature.

14. The method of claim 13, wherein said irradiating the article to change the temperature of the article comprises irradiating at least a border portion of the article to increase the article temperature relative to the ambient temperature.

15. The method of claim 14, wherein said irradiating the article to increase the temperature of the article further comprises irradiating at least an interior portion of the article.

16. The method of claim 13, wherein said irradiating the article to change the article temperature is at a higher energy than the irradiating the localized portions of the article.

17. The method of claim 13, wherein said irradiating localized portions of the article comprises irradiating portions of the article subjected to the cycles of localized irradiation.

18. A method to expose patterns of a reticle onto a wafer in a lithography system, comprising:
   loading the reticle and the wafer into a lithography system, the system being at an ambient temperature;
   applying an initial radiant heat to at least a portion of the reticle to change the temperature of the reticle relative to the ambient temperature;

applying beams of energy to localized portions of the reticle to expose the patterns of the reticle onto the wafer;

loading a second wafer; and applying a localized radiant heat to at least a portion of the reticle during the loading of a second wafer to generally maintain the temperature of the reticle relative to the ambient temperature when the reticle is not being exposed.

19. The method of claim 18, wherein the changed temperature of the reticle is approximately 0.5 to 10° K. above the ambient temperature.

20. The method of claim 18, wherein said applying the initial radiant heat includes applying localized radiant heat to a border portion of the reticle.

21. The method of claim 20, wherein said applying the initial radiant heat further includes applying localized radiant heat to the patterns on the reticle.

22. The method of claim 18, wherein said applying a localized radiant heat to the reticle during the loading of the second wafer includes applying localized radiant heat to the patterns on the reticle.

23. The method of claim 18, further comprising prior to loading a second wafer:

applying beams of energy to at least one other reticle to expose the patterns of the other reticle onto the wafer;

applying a localized radiant heat to at least a portion of the reticle when the other reticle is being exposed.

* * * * *